US012635366B2

(12) United States Patent
   Gu et al.

(10) Patent No.: US 12,635,366 B2
(45) Date of Patent: May 19, 2026

(54) ARRAY SUBSTRATE AND DISPLAY DEVICE HAVING INTERPOSER WITH FAN-OUT REGION

(71) Applicant: BOE Technology Group Co., Ltd., Beijing (CN)

(72) Inventors: Renquan Gu, Beijing (CN); Qi Yao, Beijing (CN); Jaiil Ryu, Beijing (CN); Zhiwei Liang, Beijing (CN); Yingwei Liu, Beijing (CN); Wusheng Li, Beijing (CN); Muxin Di, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 672 days.

(21) Appl. No.: 17/975,894

(22) Filed: Oct. 28, 2022

(65) Prior Publication Data

US 2023/0049038 A1        Feb. 16, 2023

Related U.S. Application Data

(63) Continuation-in-part of application No. 16/761,823, filed as application No. PCT/CN2019/079644 on Mar. 26, 2019, now Pat. No. 11,502,153.

(51) Int. Cl.
   *H10K 59/131*        (2023.01)
   *H10K 59/126*        (2023.01)
   *H10K 59/12*         (2023.01)

(52) U.S. Cl.
   CPC ......... *H10K 59/131* (2023.02); *H10K 59/126* (2023.02); *H10K 59/1201* (2023.02)

(58) Field of Classification Search
   CPC . H10K 59/131; H10K 59/126; H10K 59/1201
   See application file for complete search history.

(56) References Cited

U.S. PATENT DOCUMENTS

| | | | |
|---|---|---|---|
| 6,376,288 B1 | 4/2002 | Jen et al. | |
| 2003/0008437 A1 | 1/2003 | Inoue et al. | |

(Continued)

FOREIGN PATENT DOCUMENTS

| | | |
|---|---|---|
| CN | 105552085 A | 5/2016 |
| CN | 106384740 A | 2/2017 |

(Continued)

OTHER PUBLICATIONS

International search report of PCT application No. PCT/CN2019/079644 issued on Dec. 31, 2019.

(Continued)

*Primary Examiner* — Lex H Malsawma
(74) *Attorney, Agent, or Firm* — Lippes Mathias LLP

(57)        ABSTRACT

An array substrate and a manufacturing method thereof, a display device and a manufacturing method thereof are provided, which belong to the technical field of display. The array substrate includes: an interposer substrate, a fan-out region and a thin-film transistor disposed on one side of the interposer substrate, and a bonding connection line disposed on the other side of the interposer substrate. The bonding connection line includes a first lead and a second lead that are insulated from each other. The interposer substrate is provided with a first interposer via hole and a second interposer via hole. The first lead is electrically connected to the thin-film transistor by a conductive structure in the first interposer via hole and the fan-out region, and the second lead is electrically connected to the thin-film transistor by a conductive structure in the second interposer via hole and the fan-out region.

20 Claims, 11 Drawing Sheets

(56)        References Cited

U.S. PATENT DOCUMENTS

| | | | | |
|---|---|---|---|---|
| 2003/0024635 | A1 | 2/2003 | Utsunomiya | |
| 2003/0168969 | A1 | 9/2003 | Tanabe | |
| 2005/0017268 | A1 | 1/2005 | Tsukamoto et al. | |
| 2016/0013091 | A1 | 1/2016 | Kim et al. | |
| 2016/0163765 | A1 | 6/2016 | Hu et al. | |
| 2017/0301724 | A1 | 10/2017 | Lee | |
| 2021/0202530 | A1 | 7/2021 | Yao et al. | |
| 2023/0033837 | A1* | 2/2023 | Cha ...................... | H10H 20/857 |
| 2023/0143994 | A1* | 5/2023 | Kim ...................... | H10K 59/18 |
| | | | | 257/40 |
| 2023/0216003 | A1* | 7/2023 | Lee ...................... | H10H 20/833 |
| | | | | 257/79 |
| 2023/0246148 | A1* | 8/2023 | Lee ...................... | H10D 89/911 |
| | | | | 257/79 |
| 2023/0275114 | A1* | 8/2023 | Jang ...................... | H10D 86/60 |
| 2023/0282650 | A1* | 9/2023 | Jang .................. | H10D 86/0231 |

FOREIGN PATENT DOCUMENTS

| | | | |
|---|---|---|---|
| CN | 107256870 A | 10/2017 | |
| JP | 2010243525 A | 10/2010 | |

OTHER PUBLICATIONS

Non-final office Action of U.S. Appl. No. 16/761,823 issued on Mar. 24, 2022.
Notice of allowance of U.S. Appl. No. 16/761,823 issued on Jul. 8, 2022.

* cited by examiner

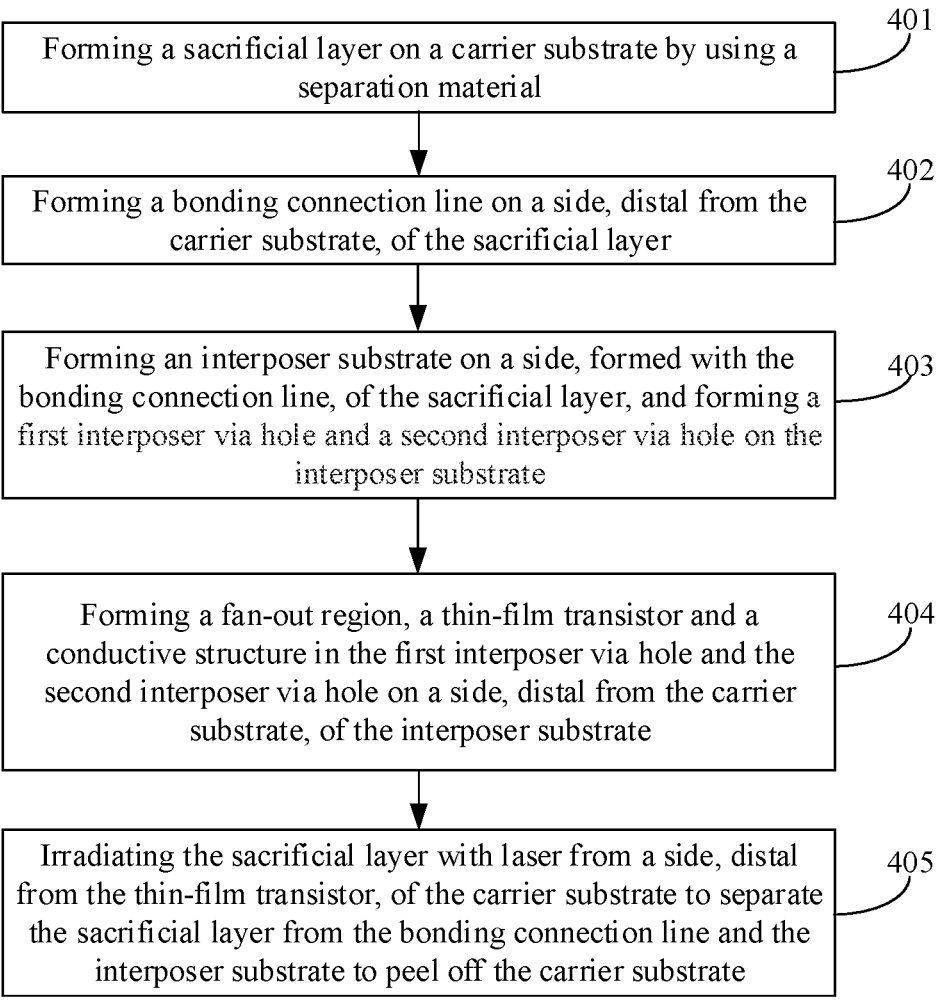

Forming a sacrificial layer on a carrier substrate by using a separation material — 401

Forming a bonding connection line on a side, distal from the carrier substrate, of the sacrificial layer — 402

Forming an interposer substrate on a side, formed with the bonding connection line, of the sacrificial layer, and forming a first interposer via hole and a second interposer via hole on the interposer substrate — 403

Forming a fan-out region, a thin-film transistor and a conductive structure in the first interposer via hole and the second interposer via hole on a side, distal from the carrier substrate, of the interposer substrate — 404

Irradiating the sacrificial layer with laser from a side, distal from the thin-film transistor, of the carrier substrate to separate the sacrificial layer from the bonding connection line and the interposer substrate to peel off the carrier substrate — 405

Fig. 4

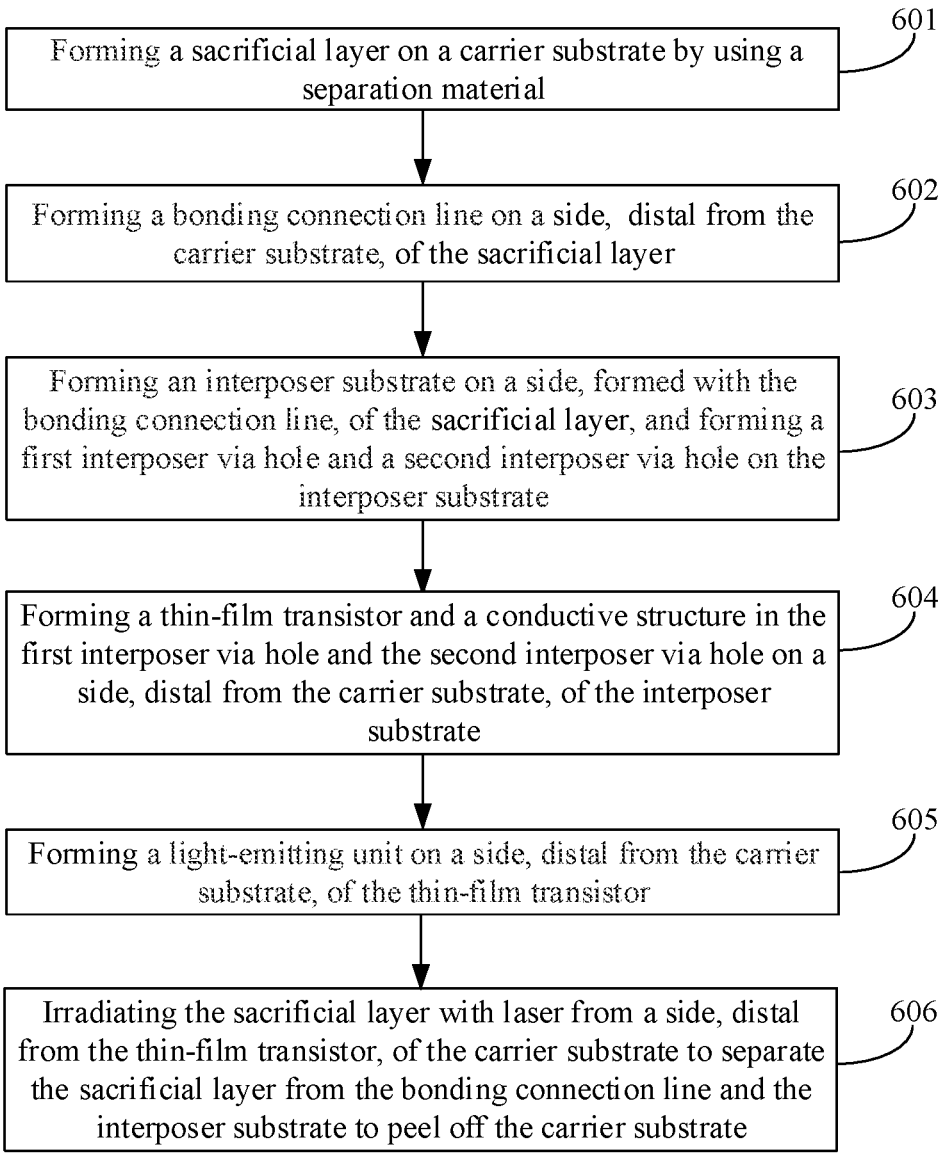

Forming a sacrificial layer on a carrier substrate by using a separation material 　601

Forming a bonding connection line on a side, distal from the carrier substrate, of the sacrificial layer 　602

Forming an interposer substrate on a side, formed with the bonding connection line, of the sacrificial layer, and forming a first interposer via hole and a second interposer via hole on the interposer substrate 　603

Forming a thin-film transistor and a conductive structure in the first interposer via hole and the second interposer via hole on a side, distal from the carrier substrate, of the interposer substrate 　604

Forming a light-emitting unit on a side, distal from the carrier substrate, of the thin-film transistor 　605

Irradiating the sacrificial layer with laser from a side, distal from the thin-film transistor, of the carrier substrate to separate the sacrificial layer from the bonding connection line and the interposer substrate to peel off the carrier substrate 　606

ARRAY SUBSTRATE AND DISPLAY DEVICE HAVING INTERPOSER WITH FAN-OUT REGION

CROSS-REFERENCE TO RELATED APPLICATION

This application is a continuation in part of U.S. application Ser. No. 16/761,823, filed on May 6, 2020, which is a 371 of PCT Application No. PCT/CN2019/079644, filed on Mar. 26, 2019, the disclosures of which are herein incorporated by reference in their entirety.

TECHNICAL FIELD

The present disclosure relates to the technical field of display, and in particular, relates to an array substrate and a manufacturing method thereof, and a display device and a manufacturing method thereof.

BACKGROUND

With the rapid development of display technology, full screen has become the focus of research in the field of display technology. Narrowing the bezel of the display screen is a prerequisite for achieving a full screen.

SUMMARY

The present disclosure provides an array substrate and a manufacturing method thereof, and a display device and a manufacturing method thereof. The technical solutions are as follows:

According to some embodiments of the present disclosure, an array substrate is provided. The array substrate includes:

an interposer substrate, a fan-out region disposed on one side of the interposer substrate, a thin-film transistor disposed on one side, distal from the interposer substrate, of the fan-out region, and a bonding connection line disposed on the other side of the interposer substrate;

an orthographic projection of the fan-out region onto the interposer substrate is partially overlapped with an orthographic projection of the thin-film transistor onto the interposer substrate; and the bonding connection line is configured to be connected to a drive circuit, and includes a first lead and a second lead that are insulated from each other;

wherein the interposer substrate is provided with a first interposer via hole and a second interposer via hole, conductive structure is arranged in the first interposer via hole and the second the interposer via hole, the first lead is electrically connected to the thin-film transistor by the conductive structure in the first interposer via hole and the fan-out region, and the second lead is electrically connected to the thin-film transistor by the conductive structure in the second interposer via hole and the fan-out region.

In some embodiments, the first interposer via hole and the second interposer via hole are respectively arranged on a first end and a second end of the interposer substrate, the first end is opposite to the second end;

wherein the first lead is disposed on the first end of the interposer substrate and is configured to be connected to a gate drive circuit in the drive circuit, and the second lead is disposed on the second end of the interposer substrate and is configured to be connected to a data drive circuit in the drive circuit;

the fan-out region includes a first sub-fan-out region and a second sub-fan-out region, wherein the first sub-fan-out region and the second sub-fan-out region are respectively disposed on the first end and the second end of the interposer substrate; and a gate of the thin-film transistor is electrically connected to the conductive structure in the first interposer via hole by the first sub-fan-out region, and a source or a drain of the thin-film transistor is electrically connected to the conductive structure in the second interposer via hole by the second sub-fan-out region.

In some embodiments, the array substrate further includes a shield layer disposed on the side, distal from the bonding connection line, of the interposer substrate;

the shield layer includes a shield pattern and a connecting lead connected with the shield pattern, and the shield pattern is the same as an active layer pattern of the thin-film transistor.

In some embodiments, the shield layer is electrically connected to the drive circuit by a connecting line through a fourth interposer via hole to apply a constant voltage.

In some embodiments, at least one of the thin-film transistors includes a gate electrode, a gate insulating layer, an active layer pattern, and a source-drain pattern that are stacked in a direction distal from the interposer substrate, wherein the source-drain pattern includes a source and a drain.

In some embodiments, the gate of the thin-film transistor and the conductive structure in the first interposer via hole are integrally formed.

In some embodiments, at least one of the thin-film transistors includes a first gate electrode, a first gate insulating layer, an active layer pattern, a second gate insulating layer, a second gate electrode, a passivation layer, and a source-drain pattern that are stacked in a direction distal from the interposer substrate, wherein the source-drain pattern includes a source and a drain.

In some embodiments, the second gate electrode of the thin-film transistor is electrically connected to the source-drain pattern by a first via hole, and the first gate electrode of the thin-film transistor is electrically connected to the source-drain pattern by a second via hole.

In some embodiments, the first gate electrode of the thin-film transistor is arranged on a same layer with the fan-out region.

In some embodiments, at least one of the thin-film transistors includes an active layer pattern, a gate insulating layer, a gate pattern, a passivation layer, and a source-drain pattern that are stacked in a direction distal from the interposer substrate, wherein the gate pattern comprises a gate and a gate lead, and the source-drain pattern includes a source and a drain.

In some embodiments, the fan-out region includes a hollow part, and the hollow part is overlapped with an active layer pattern of the thin film transistor.

In some embodiments, the interposer substrate is further provided with a third interposer via hole, a conductive structure is arranged in the third interposer via hole, a VDD line and a VSS line of the thin-film transistor are electrically connected to the bonding connection line by the fan-out region and the conductive structure in the third interposer via hole.

In some embodiments, the array substrate further comprises a bonding pad disposed on a side, distal from the interposer substrate, of the thin-film transistor.

According to some embodiments of the present disclo-
sure, a manufacturing method of an array substrate is
provided. The method includes:

forming a sacrificial layer on a carrier substrate by using
a separation material;

forming a bonding connection line on a side, distal from
the carrier substrate, of the sacrificial layer, wherein the
bonding connection line includes a first lead and a
second lead that are insulated from each other;

forming an interposer substrate on a side, formed with the
bonding connection line, of the sacrificial layer,
wherein the interposer substrate is provided with a first
interposer via hole and a second interposer via hole,
and an adhesion between the separation material and
the carrier substrate is greater than an adhesion between
the separation material and the bonding connection
line, and is greater than an adhesion between the
separation material and the interposer substrate;

forming a fan-out region, a thin-film transistor and con-
ductive structure in the first interposer via hole and the
second interposer hole on a side, distal from the carrier
substrate, of the interposer substrate, wherein an ortho-
graphic projection of the fan-out region onto the inter-
poser substrate is partially overlapped with an ortho-
graphic projection of the thin-film transistor onto the
interposer substrate, the first lead is electrically con-
nected to the thin-film transistor by the conductive
structure in the first interposer via hole and the fan-out
region, and the second lead is electrically connected to
the thin-film transistor by the conductive structure in
the second interposer via hole and the fan-out region;
and irradiating the sacrificial layer with laser from a side,
distal from the thin-film transistor, of the carrier sub-
strate to separate the sacrificial layer from the bonding
connection line and the interposer substrate to peel off
the carrier substrate.

In some embodiments, forming the interposer substrate on
the side, formed with the bonding connection line, of the
sacrificial layer includes:

forming a substrate layer by coating and curing an organic
resin material on the side, formed with the bonding
connection line, of the sacrificial layer, wherein the first
interposer via hole and the second interposer via hole
are respectively arranged on a first end and a second
end of the substrate layer, the first end is opposite to the
second end; and respectively forming the first interposer via hole and the
second interposer via hole on the first end and the
second end of the substrate layer to obtain the inter-
poser substrate;

wherein the fan-out region includes a first sub-fan-out
region and a second sub-fan-out region, wherein the
first sub-fan-out region and the second sub-fan-out
region are respectively disposed on the first end and the
second end of the interposer substrate; a gate of the
thin-film transistor is electrically connected to the first
lead by the conductive structure in the first interposer
via hole and the first sub-fan-out region, and a source
or a drain of the thin-film transistor is electrically
connected to the second lead by the conductive struc-
ture in the second interposer via hole and the second
sub-fan-out region, the first lead is configured to con-
nect a gate drive circuit in the drive circuit, and the
second lead is configured to connect a data drive circuit
in the drive circuit.

In some embodiments, forming the fan-out region, the
thin-film transistor and the conductive structure in the first
interposer via hole and the second interposer via hole on the
side, distal from the carrier substrate, of the interposer
substrate includes:

forming a conductive layer on the side, distal from the
carrier substrate, of the interposer substrate by using a
conductive material;

patterning the conductive layer to form the fan-out region,
a gate of the thin-film transistor and the conductive
structure in the first interposer via hole and the second
interposer via hole; and sequentially forming a gate insulating layer, an active
layer pattern, and a source-drain pattern of the thin-film
transistor on a side, formed with the fan-out region, the
gate and the conductive structure, of the interposer
substrate;

or forming the conductive layer on the side, distal from the
carrier substrate, of the interposer substrate by using
the conductive material;

forming the conductive structure in the first interposer via
hole and the second interposer via hole by patterning
the conductive layer; and sequentially forming the fan-out region and the thin-film
transistor on a side, formed with the conductive struc-
ture, of the interposer substrate.

In some embodiments, before forming the active layer
pattern of the thin-film transistor, the method further
includes:

forming a shield layer on the side, formed with at least the
fan-out region and the conductive structure, of the
interposer substrate, wherein the shield layer includes a
shield pattern and a connecting lead connected with the
shield pattern, and the shield pattern is the same as an
active layer pattern of the thin-film transistor.

According to some embodiments of the present disclo-
sure, a display device is provided. The display device
includes: a light-emitting unit and an array substrate;

the light-emitting unit is disposed on a side, distal from
the interposer substrate, of the thin-film transistor in the
array substrate; and the array substrate, including:

an interposer substrate, a fan-out region disposed on one
side of the interposer substrate, a thin-film transistor
disposed on one side, distal from the interposer sub-
strate, of the fan-out region, and a bonding connection
line disposed on the other side of the interposer sub-
strate;

an orthographic projection of the fan-out region onto the
interposer substrate is partially overlapped with an
orthographic projection of the thin-film transistor onto
the interposer substrate; and the bonding connection line is configured to be connected
to a drive circuit, and comprises a first lead and a
second lead that are insulated from each other;

wherein the interposer substrate is provided with a first
interposer via hole and a second interposer via hole,
conductive structure is arranged in the first interposer
via hole and the second interposer via hole, the first
lead is electrically connected to the thin-film transistor
by the conductive structure in the first interposer via
hole and the fan-out region, and the second lead is
electrically connected to the thin-film transistor by the
conductive structure in the second interposer via hole
and the fan-out region.

In some embodiments, the display device further includes a drive circuit;

the drive circuit is disposed on a side, distal from the thin-film transistor, of the interposer substrate, and the drive circuit is electrically connected to the bonding connection line in the array substrate.

In some embodiments, the light-emitting unit is electrically connected to a bonding pad of the array substrate; and the light-emitting unit includes a micro light-emitting diode, an organic light-emitting diode, or a quantum dot light-emitting diode.

BRIEF DESCRIPTION OF THE DRAWINGS

FIG. 4 is a flowchart of a manufacturing method of an array substrate according to some embodiments of the present disclosure;

FIG. 6 is a flowchart of a manufacturing method of a display device according to some embodiments of the present disclosure;

DETAILED DESCRIPTION

The present disclosure will be described in further detail with reference to the accompanying drawings, to present the objects, technical solutions, and advantages of the present disclosure more clearly.

The related art provides an interposer substrate. The interposer substrate is arranged with a plurality of interposer via holes, each of which is filled with a conductive material. One side of the interposer substrate is configured to prepare devices such as a thin-film transistor and a light-emitting unit, and the other side of the interposer substrate is configured to provide a drive circuit (Integrated Circuit, IC). The drive IC includes a gate drive circuit and a data drive circuit. One of a source and a drain in the thin-film transistor is electrically connected to the data drive circuit through the interposer via hole on the interposer substrate, and a gate of the thin-film transistor is electrically connected to the gate drive circuit through the interposer via hole on the interposer substrate. Because of a display device prepared based on the interposer substrate does not need a drive IC at the bezel, the bezel of the display device can be narrowed, thereby realising a full screen.

However, before providing the drive IC on the interposer substrate, it is necessary to form a bonding pad on the interposer substrate through a plating process or a chemical mechanical polishing (CMP) process. The bonding pad is configured to be connected to the drive IC and the thin-film transistor. After a display device is formed on one side of the interposer substrate, the display device is easily damaged in response to a bonding pad is formed on the other side of the interposer substrate. After the bonding pad is formed on the other side of the interposer substrate, the bonding pad is easily damaged in response to a display device is formed on one side of the interposer substrate. Therefore, the process of preparing a display device by using an interposer substrate is currently difficult.

Figure 1:
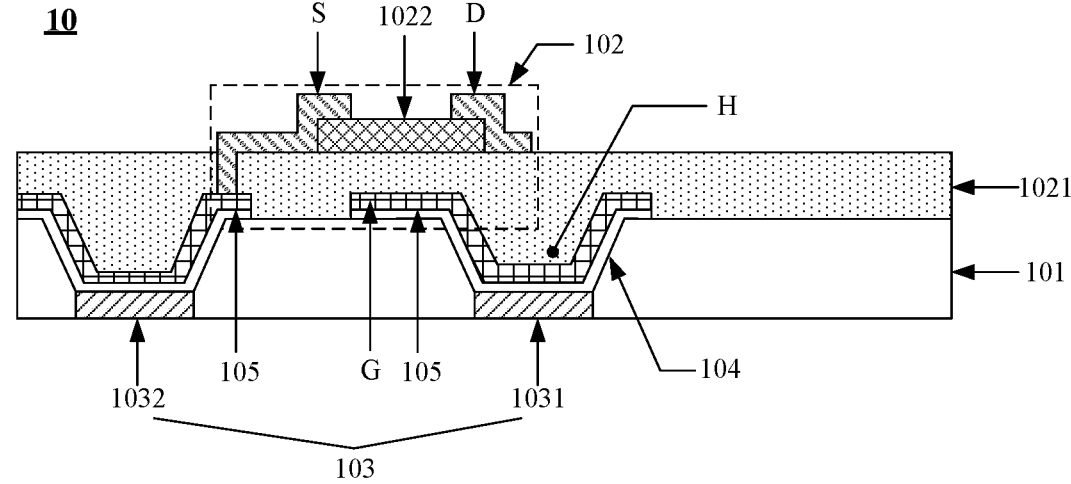
FIG. 1 is a structural schematic diagram of an array substrate according to some embodiments of the present disclosure.

FIG. 1 is a schematic structural diagram of an array substrate according to some embodiments of the present disclosure. As shown in FIG. 1, the array substrate 10 includes:

an interposer substrate 101, a fan-out region 105 disposed on one side of the interposer substrate 101, a thin-film transistor 102 disposed on one side, distal from the interposer substrate, of the fan-out region 105, and a bonding connection line 103 disposed on the other side of the interposer substrate 101. An orthographic projection of the fan-out region 105 onto the interposer substrate 101 is partially overlapped with an orthographic projection of the thin-film transistor 102 onto the interposer substrate 101. The bonding connection line 103 is configured to be connected to a drive circuit (not shown in the figure). In the embodiment of the present disclosure, the interposer substrate 101 refers to a substrate that has an interposer via hole, and a plurality of fan-out wires formed in the fan-out region.

Figure 2:
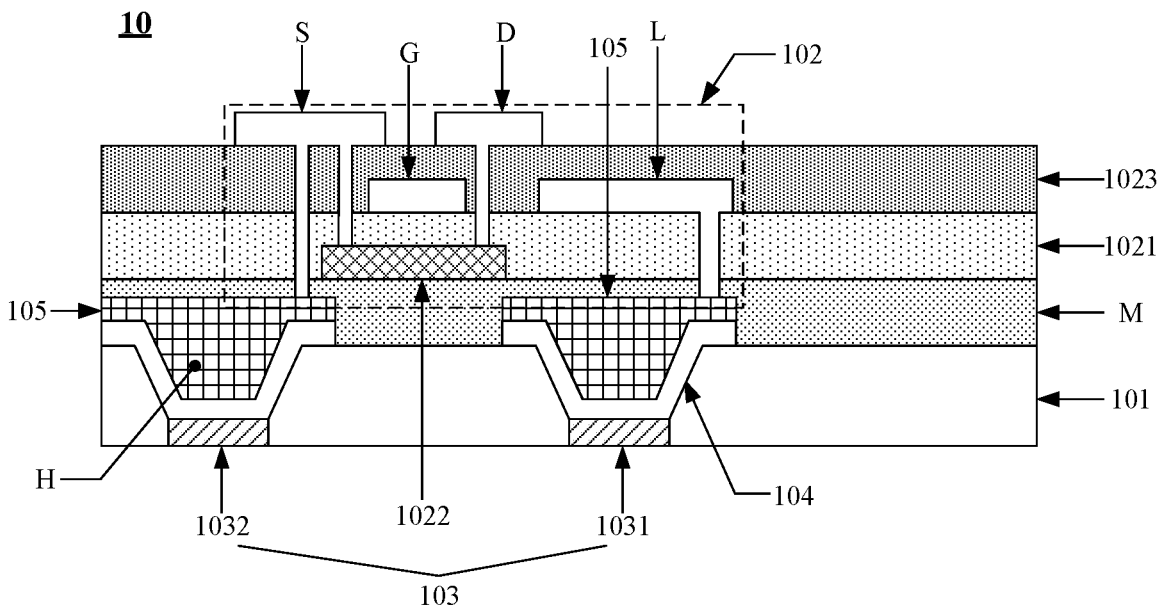
FIG. 2 is a structural schematic diagram of another array substrate according to some embodiments of the present disclosure.

Referring to FIG. 1 and FIG. 2, the bonding connection line 103 includes at least a first lead 1031 and a second lead 1032 insulated from each other. The interposer substrate 101 is provided with an interposer via hole H, the interposer via hole H includes at least a first interposer via hole and a second interposer via hole, and conductive structure 104 is arranged in the first interposer via hole and the second interposer via hole. The first lead 1031 is electrically connected to the thin-film transistor 102 by the conductive structure 104 in the first interposer via hole and the fan-out region 105, and the second lead 1032 is electrically connected to the thin-film transistor 102 by the conductive structure 104 in the second interposer via hole and the fan-out region 105.

In summary, the array substrate according to the embodiments of the present disclosure is fabricated by forming a bonding connection line on a carrier substrate, then forming an interposer substrate on the side, provided with the bonding connection line, of the carrier substrate, further forming a fan-out region and a thin-film transistor on a side, distal from the carrier substrate, of the interposer substrate, and finally peeling off the carrier substrate. Therefore, the bonding connection line is disposed on the interposer substrate. Because of the bonding connection line, the interposer substrate, the fan-out region and the thin-film transistor are sequentially formed on the carrier substrate, compared with the related art, there is no need to separately prepare the bonding connection line and the thin-film transistor on both sides of the existing interposer substrate, which improves the production yield of the array substrate, and reduces the process difficulty, In some embodiments, the material for fabricating the interposer substrate 101 includes an organic resin material. Exemplarily, the material for fabricating the interposer substrate includes at least one of a polyimide (PI) resin material, a polyester resin material, and a polyolefin resin material. In response to the interposer substrate is made of the PI resin material, the interposer substrate is referred to as a Through PI Via (TPV) substrate.

For example, FIG. 1 is a schematic structural diagram of an array substrate according to some embodiments of the present disclosure. Referring to FIG. 1, at least one of the thin-film transistors 102 includes a gate electrode G, a gate insulating layer 1021, an active layer pattern 1022, and a source-drain pattern that are stacked in a direction distal from the interposer substrate 101. The source-drain pattern includes a source S and a drain D. In this case, the thin-film transistors is a thin-film transistor with a bottom-gate structure, and the gate electrode G of the thin-film transistors is a bottom gate electrode.

For example, FIG. 2 is a schematic structural diagram of another array substrate according to some embodiments of the present disclosure. As shown in FIG. 2, in some embodiments, at least one of the thin-film transistors 102 includes an active layer pattern 1022, a gate insulating layer 1021, a gate pattern, a passivation layer 1023, and a source-drain pattern that are stacked in a direction distal from the interposer substrate 101. The gate pattern includes a gate G and a gate lead. L. The source-drain pattern includes a source S and a drain D. In this case, the thin-film transistors is a thin-film transistor with a top-gate structure, and the gate electrode G of the thin-film transistors is a top gate electrode. The active layer pattern 1022 is insulated from the conductive structure 104 in the interposer via hole H. For example, referring to FIG. 2, an insulating layer M is arranged between the active layer pattern 1022 and the interposer substrate 101.

Figure 8:
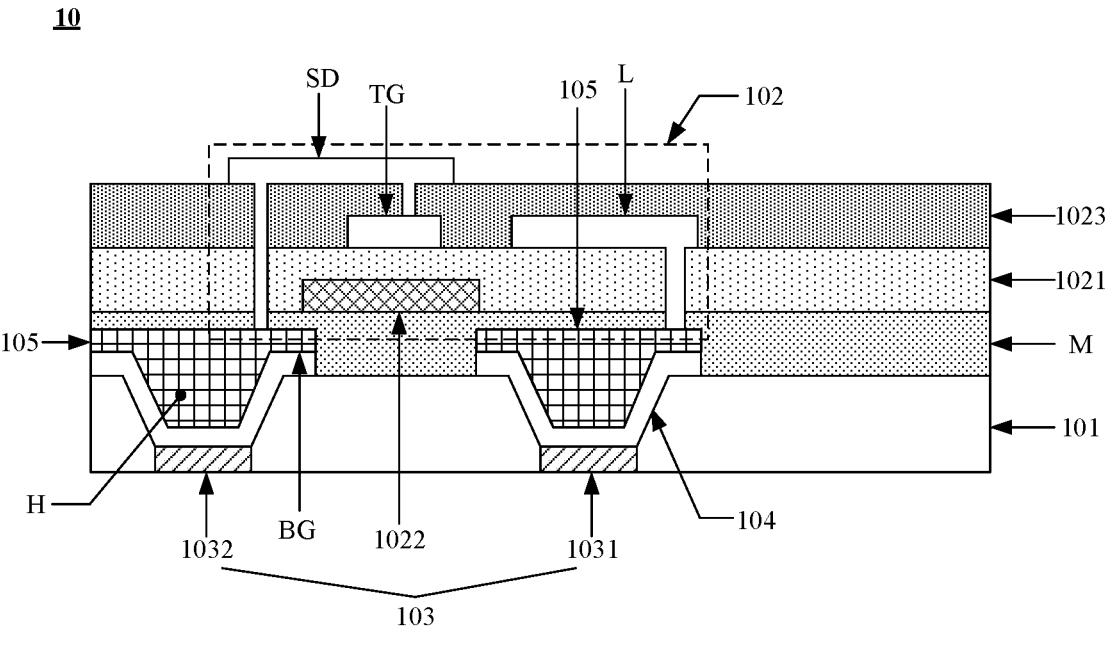
FIG. 8 is a structural schematic diagram of another array substrate according to some embodiments of the present disclosure.

For example, FIG. 8 is a schematic structural diagram of another array substrate according to some embodiments of the present disclosure. For example, as shown in FIG. 8, at least one of the thin-film transistors includes a first gate electrode BG, a first gate insulating layer IG1, an active layer pattern 1022, a second gate insulating layer IG2, a second gate electrode TG, a passivation layer 1023, and a source-drain pattern SD that are stacked in a direction distal from the interposer substrate 101. The source-drain pattern SD includes a source S and a drain D. In this case, the thin-film transistors is a thin-film transistor with a double-gate structure, the first gate electrode BG is a bottom gate, and the second gate electrode TG is a top gate.

In some embodiments, the material for fabricating the conductive structure includes at least one of aluminum (Al), neodymium (Nd), and molybdenum (Mo). The material for fabricating the gate includes at least one of aluminum, neodymium, and molybdenum. The material for fabricating the source-drain pattern includes at least one of aluminum, neodymium, and molybdenum. The material for fabricating the active layer pattern includes at least one of Indium Gallium Zinc Oxide (IGZO), Low Temperature Poly-silicon (LTPS) and Low Temperature Polycrystalline Oxide (LTPO).

Figure 9:
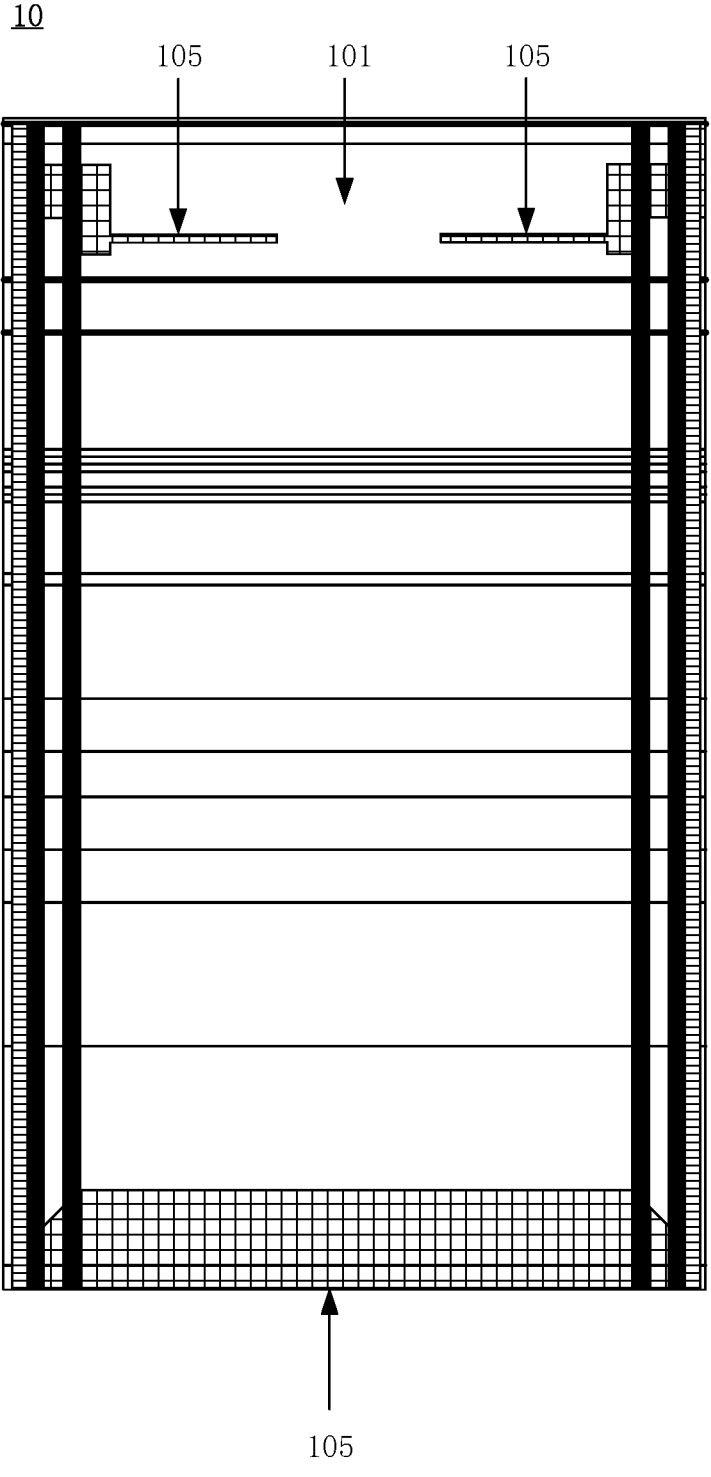
FIG. 9 is a structural schematic diagram of a front surface of an array substrate according to some embodiments of the present disclosure.

In some embodiments, referring to FIG. 1, FIG. 2 and FIG. 9, the first interposer via hole and the second interposer via hole are respectively arranged on a first end and a second end of the interposer substrate 101, wherein the first end is opposite to the second end. The first lead 1031 is disposed on the first end of the interposer substrate 101 and is configured to be connected to a gate drive circuit in the drive circuit (not shown in the figure), and the second lead 1032 is disposed on the second end of the interposer substrate 101 and is configured to be connected to a data drive circuit (not shown in the figure) in the drive circuit. The fan-out region 105 includes a first sub-fan-out region and a second sub-fan-out region, wherein the first sub-fan-out region and the second sub-fan-out region are respectively disposed on the first end and the second end of the interposer substrate 101. For example, he first end and the second end are the upper end and the lower end respectively. The gate G of the thin-film transistor 102 is electrically connected to the first lead 1031 by the first sub-fan-out region and the conductive structure 104 in the first interposer via hole. One of the source S and the drain D of the thin-film transistor 102 is electrically connected to the second lead 1032 by the second sub-fan-out region and the conductive structure 104 in the second interposer via hole. For example, in FIG. 1 and FIG. 2, the source S of the thin-film transistor 102 is electrically connected to the second lead 1032 by the conductive structure in the second interposer via hole. The first lead 1031 is configured to be connected to a gate drive circuit in the drive circuit. The second lead 1032 is configured to be connected to a data drive circuit in the drive circuit. In some embodiments, the bonding connection line further includes other leads, for example, includes a lead for connecting a power control circuit and the like.

In some embodiments, a plurality of gate control lines are disposed in the first sub-fan-out region. One end of each gate control line is electrically connected to the gate G of the thin-film transistor 102 by a gate on array (GOA) circuit, and the other end of each gate control line is electrically connected to the first lead 1031 by the conductive structure 104 in the first interposer via hole. A plurality of data control lines are disposed in the second sub-fan-out region, one end of each data control line is electrically connected to the source S or the drain D of the thin-film transistor, and the other end of each data control line is electrically connected to the second lead 1032 by the conductive structure 104 in the second interposer via hole.

In some embodiments, the interposer substrate 101 is further provided with a third interposer via hole, a conductive structure 104 is arranged in the third interposer via hole, a VDD line and a VSS line of the thin-film transistor 102 are electrically connected to the bonding connection line 103 by the fan-out region 105 and the conductive structure 104 in the third interposer via hole.

Figure 10:
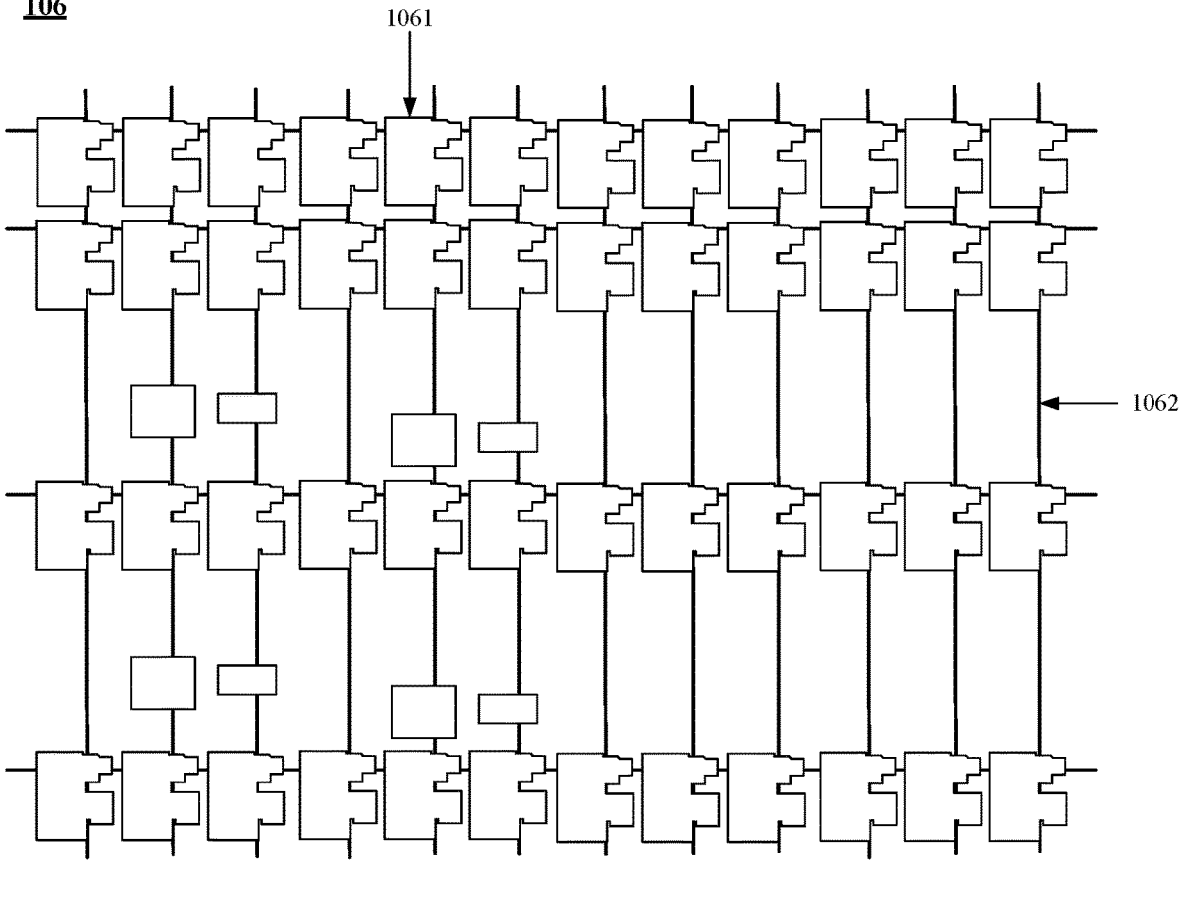
FIG. 10 is a structural schematic diagram of a shield layer according to some embodiments of the present disclosure.
Figures 11, 12:
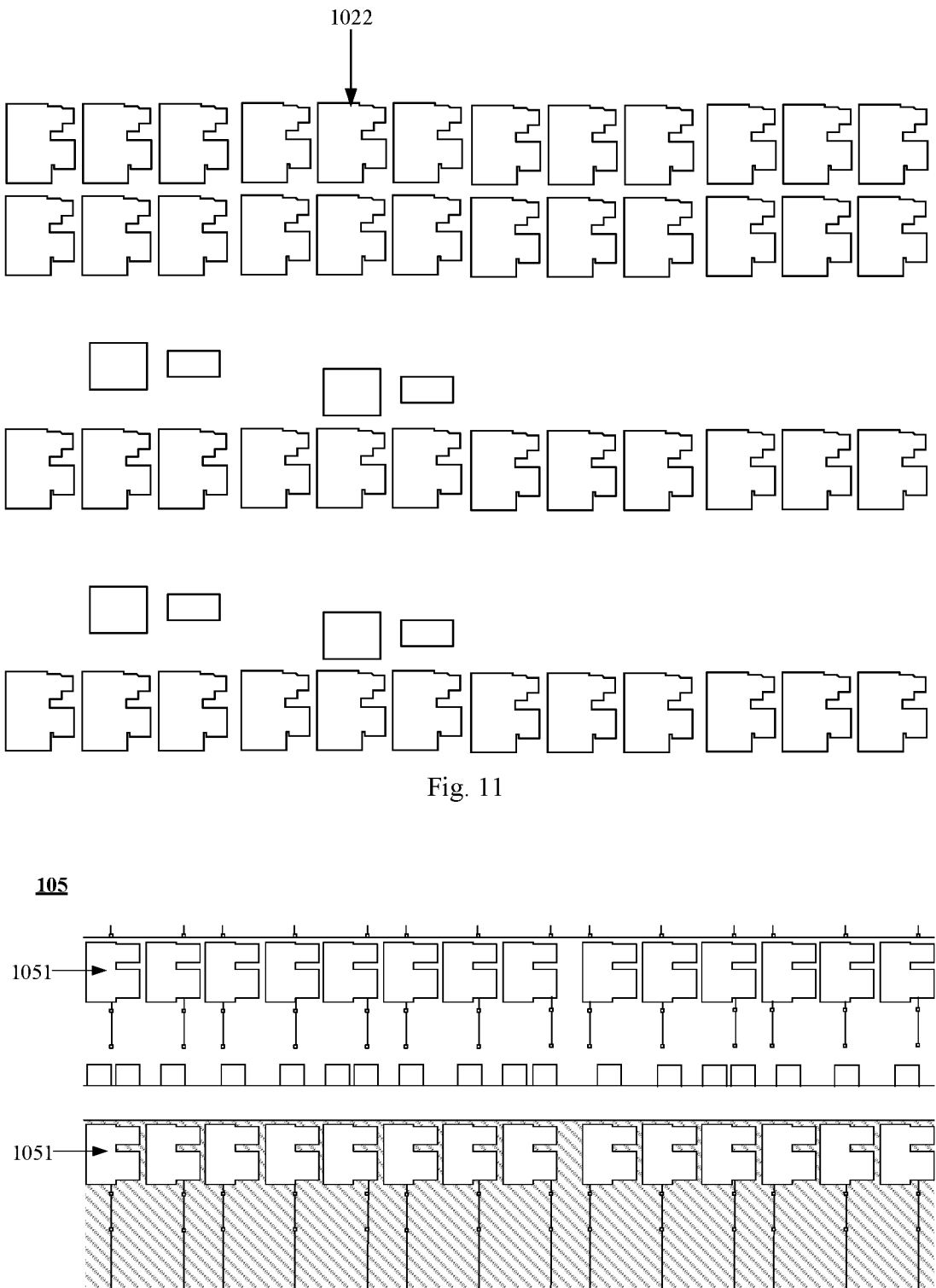
FIG. 11 is a structural schematic diagram of an active layer pattern according to some embodiments of the present disclosure.
FIG. 12 is a structural schematic diagram of a fan-out region according to some embodiments of the present disclosure.

In some embodiments, as shown in FIG. 10 and FIG. 11, the array substrate further includes a shield layer 106 disposed on the side, distal from the bonding connection line 103, of the interposer substrate 101. The shield layer 106 includes a shield pattern 1061 and a connecting lead 1062 connected with the shield pattern 1061, and the shield pattern 1061 is the same as an active layer pattern 1022 of the thin-film transistor 102. The active layer pattern 1022 is disposed on the side, distal from the interposer substrate 101, of the shield pattern 1061.

As shown in FIG. 10, the shield layer 106 includes a plurality of shield patterns 1061. A plurality of connecting leads 1062 are arranged along the direction of the row to connect the shield patterns 1061 in the same row, and a plurality of connecting leads 1062 are arranged along the direction of the column to connect the shield patterns 1061 in the same column.

Figure 13:
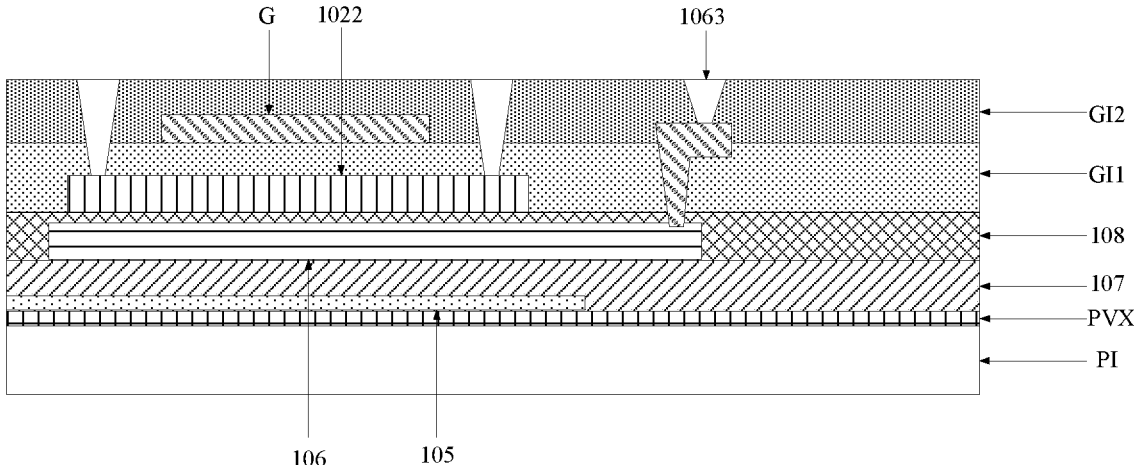
FIG. 13 is a structural schematic diagram at a cross section of a shield layer according to some embodiments of the present disclosure.

FIG. 13 shows the structure of part of a array substrate. The array substrate includes a PI layer, a PVX layer, a fan-out region 105, a barrier layer 107, a shield layer 106, a buffer layer 108, an active layer pattern 1022, a first gate insulating layer GI1, a gate G and a second gate insulating layer GI2 arranged in sequence. As shown in FIG. 13, a constant voltage is applied to the shield layer 106 by a connecting line (not shown in the figure) through a fourth interposer via hole 1063, and the connection line is electrically connected to the shield layer 106 and the driver circuit (not shown in the figure) respectively. When the thin film transistor 102 is driven, the gate control lines and the data control lines in the fan-out region 105 has a change of current passes to generate a electromagnetic field, which affects the performance of active layer pattern 1022. The electromagnetic field is shielded by setting a shield layer 106, so as to reduce the impact on the performance of active layer pattern 1022.

In some embodiments, referring to FIG. 1, in response to the thin-film transistor 102 is the thin-film transistor with the bottom-gate structure, the gate G of the thin-film transistor 102 and the conductive structure 104 in the first interposer via hole are integrally formed.

It should be noted that the gate of the thin-film transistor and the conductive structure in the first interposer via hole are integrally formed. That is, the gate of the thin-film transistor and the conductive structure in the first interposer via hole are prepared at the same layer, which simplifies the fabrication process of the array substrate.

In some embodiments, as shown in FIG. 8, when the thin-film transistor 102 is a thin-film transistor with double-gate structure, a top gate electrode TG of the thin-film transistor 102 is electrically connected to a source-drain pattern SD by a first via hole, and a bottom gate electrode BG of the thin-film transistor is electrically connected to the source-drain pattern SD by a second via hole.

In some embodiments, as shown in FIG. 12, the fan-out region 105 includes a hollow part 1051. When the orthographic projection of the fan-out region 105 onto the interposer substrate 101 is partially overlapped with the orthographic projection of the thin-film transistor 102 onto the interposer substrate 101, the hollow part 1051 is overlapped with the active layer pattern 1022 of the thin film transistor.

In some embodiments, in response to the orthographic projection of the fan-out region onto the interposer substrate is partially overlapped the orthographic projection of the thin-film transistor onto the interposer substrate, the double-gate structure of the thin-film transistor is located in the non-fan-out region.

Figure 14:
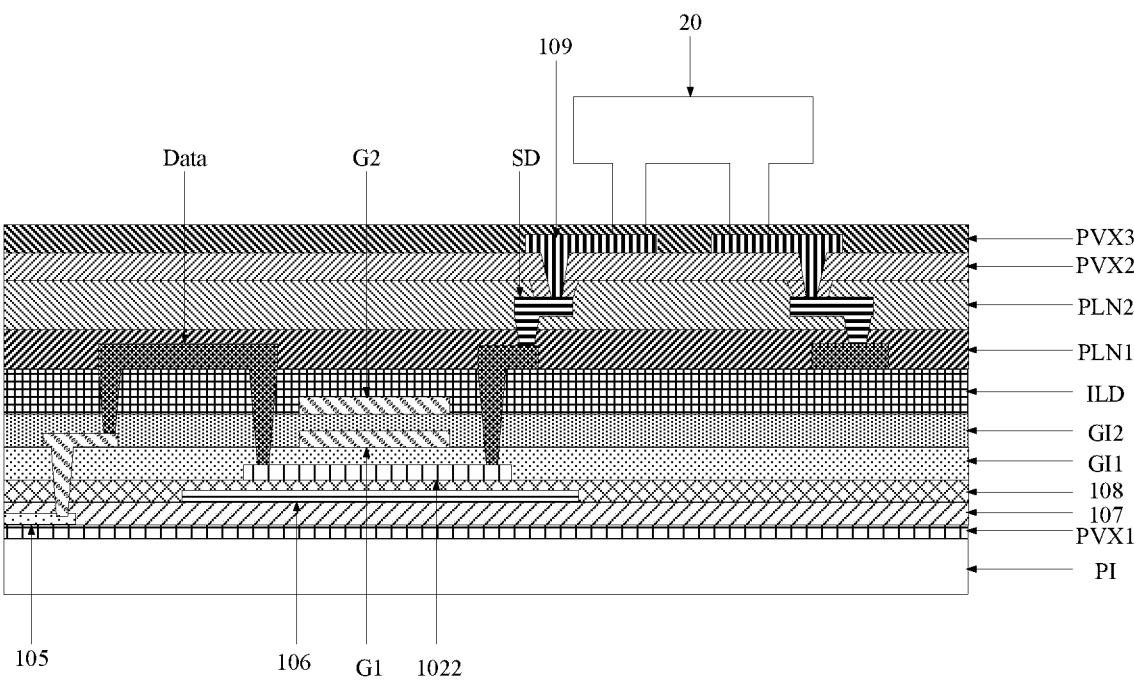
FIG. 14 is a structural schematic diagram of part of a display device according to some embodiments of the present disclosure.

In some embodiments, as shown in FIG. 14, the array substrate 10 further includes a bonding pad 109 disposed on a side, distal from the interposer substrate 101, of the thin-film transistor 102. The bonding pad 109 is configured to bond light-emitting unit 20.

In summary, the array substrate according to the embodiment of the present disclosure is fabricated by forming a bonding connection line on a carrier substrate, then forming an interposer substrate on the carrier substrate having the bonding connection line, further forming a fan-out region and a thin-film transistor on a side of the interposer substrate distal from the carrier substrate, and finally peeling off the carrier substrate, such that the bonding connection line is disposed on the interposer substrate. Since the bonding connection line, the interposer substrate, fan-out region and the thin-film transistor are sequentially formed on the carrier substrate, compared with the related art, there is no need to separately prepare the bonding connection line and the thin-film transistor on both sides of the existing interposer substrate, which improves the fabrication yield of the array substrate, reduces the process difficulty, and also reduces the fabrication cost of the array substrate.

Some embodiments of the present disclosure provides a display device, the display device includes a light-emitting unit and an array substrate 10 as shown in FIG. 1, FIG. 2 or FIG. 8.

Figure 3:
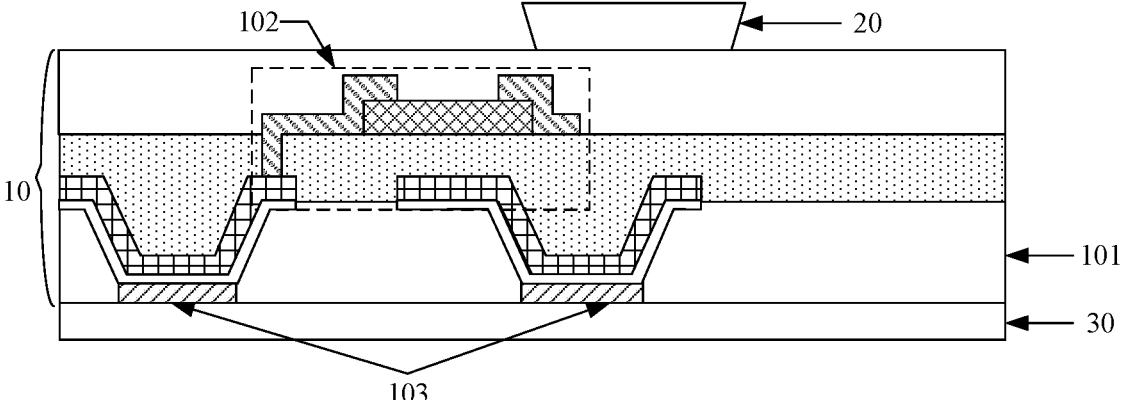
FIG. 3 is a structural schematic diagram of a display device according to some embodiments of the present disclosure.

For example, FIG. 3 is a schematic structural diagram of a display device according to some embodiments of the present disclosure. The display device includes an array substrate 10 as shown in FIG. 1. As shown in FIG. 3, a light-emitting unit 20 in the display device is disposed on a side, distal from the interposer substrate 101, of the thin-film transistor 102 in the array substrate 10.

In some embodiments, continue to refer to FIG. 3, the display device further includes a drive circuit 30. The drive circuit 30 is disposed on a side, distal from the thin-film transistor 102, of the interposer substrate 101, and the drive circuit 30 is connected to the bonding connection line 103 in the array substrate 10.

It should be noted that the drive circuit includes a gate drive circuit and a data drive circuit. The gate drive circuit is configured to provide a gate drive signal to the gate of the thin-film transistor. The data drive circuit is configured to provide a data drive signal to one of the source and the drain of the thin-film transistor. In the embodiment of the present disclosure, the drive circuit is a drive IC.

In some embodiments, the light-emitting unit 20 includes one of a micro light-emitting diode (Micro LED, also referred to as u-LED), an organic light-emitting diode (OLED), and quantum dot light-emitting Diode (QLED). In response to the light-emitting unit 20 is the u-LED, the light-emitting unit 20 is fixedly arranged on the array substrate 10 by bonding. For example, FIG. 14 shows a structure of part of the display device. The display device includes a PI layer, a first passivation layer PVX1, a fan-out region 105, a barrier layer 107, a shield layer 106, a buffer layer 108, an alive layer pattern 1022, a first gate insulating layer GI1, a first gate G1, a second gate insulating layer GI2, a second gate G2, an inter-level dielectric layer ILD, a data layer Data, a first planarization PLN1, a source-drain pattern SD, a second planarization PLN2, a second passivation layer PVX2, a bonding pad 109, a third passivation layer PVX3 and light-emitting unit 20 arranged in sequence. As shown in FIG. 14, the electrode of the light-emitting unit 20 is fixedly arranged on the bonding pad 108 of the array substrate 10 by bonding.

In summary, according to the display device provided by the embodiments of the present disclosure, the array substrate is fabricated by forming a sacrificial layer and a bonding connection line on a carrier substrate, then forming an interposer substrate on a side, formed with a bonding connection line, of the sacrificial layer, further forming a fan-out region and a thin-film transistor is on a side, distal from the carrier substrate, of the interposer substrate, and finally peeling off the carrier substrate, such that the bonding connection line is disposed on the interposer substrate. Since the bonding connection line, the interposer substrate, the fan-out region and the thin-film transistor are sequentially formed on the carrier substrate, compared with the related art, there is no need to separately prepare the bonding connection line and the thin-film transistor on both sides of the existing interposer substrate, which improves the fabrication yield of the array substrate, reduces the process difficulty, and then improves the reliability of the fabricated display device.

FIG. 4 is a flowchart of a manufacturing method of an array substrate according to an embodiment of the present disclosure. As shown in FIG. 4, the method includes the following steps.

In step 401, a sacrificial layer is formed on a carrier substrate by using a separation material, In step 402, a bonding connection line is formed on a side, distal from the carrier substrate, of the sacrificial layer. The bonding connection line includes a first lead and a second lead that are insulated from each other.

In step 403, an interposer substrate is formed on a side, formed with the bonding connection line, of the sacrificial layer, and the interposer substrate is provided with a first interposer via hole and a second interposer via hole. An adhesion between the separation material and the carrier substrate is greater than an adhesion between the separation material and the bonding connection line, and is greater than an adhesion between the separation material and the interposer substrate.

In step 404, a fan-out region, a thin-film transistor and conductive structure in the first interposer via hole and the second interposer via hole are formed on a side, distal from the carrier substrate, of the interposer substrate. An orthographic projection of the fan-out region onto the interposer substrate is partially overlapped with an orthographic projection of the thin-film transistor onto the interposer substrate. The first lead is electrically connected to the thin-film transistor by the conductive structure in the first interposer via hole and the fan-out region, and the second lead is electrically connected to the thin-film transistor by the conductive structure in the second interposer via hole and the fan-out region.

In step 405, the sacrificial layer is irradiated with laser from a side, distal from the thin-film transistor, of the carrier substrate to be separated from the bonding connection line and the interposer substrate, so that the carrier substrate is peeled off.

In summary, according to the method for manufacturing an array substrate provided by the embodiments of the present disclosure, a sacrificial layer is formed on a carrier substrate, then a bonding connection line is formed on the sacrificial layer, after that an interposer substrate is formed on the side, formed with the bonding connection line, of the sacrificial layer, further a fan-out region and a thin-film transistor are formed on a side, distal from the carrier substrate, of the interposer substrate, and finally the sacrificial layer is irradiated with laser to be separated from the bonding connection line and the interposer substrate, so that the carrier substrate is peeled off to obtain the array substrate. Since the bonding connection line, the interposer substrate, the fan-out region and the thin-film transistor are sequentially formed on the carrier substrate, compared with the related art, there is no need to separately prepare the bonding connection line and the thin-film transistor on both sides of the existing interposer substrate, which improves the fabrication yield of the array substrate, and reduces the process difficulty.

Figure 5:
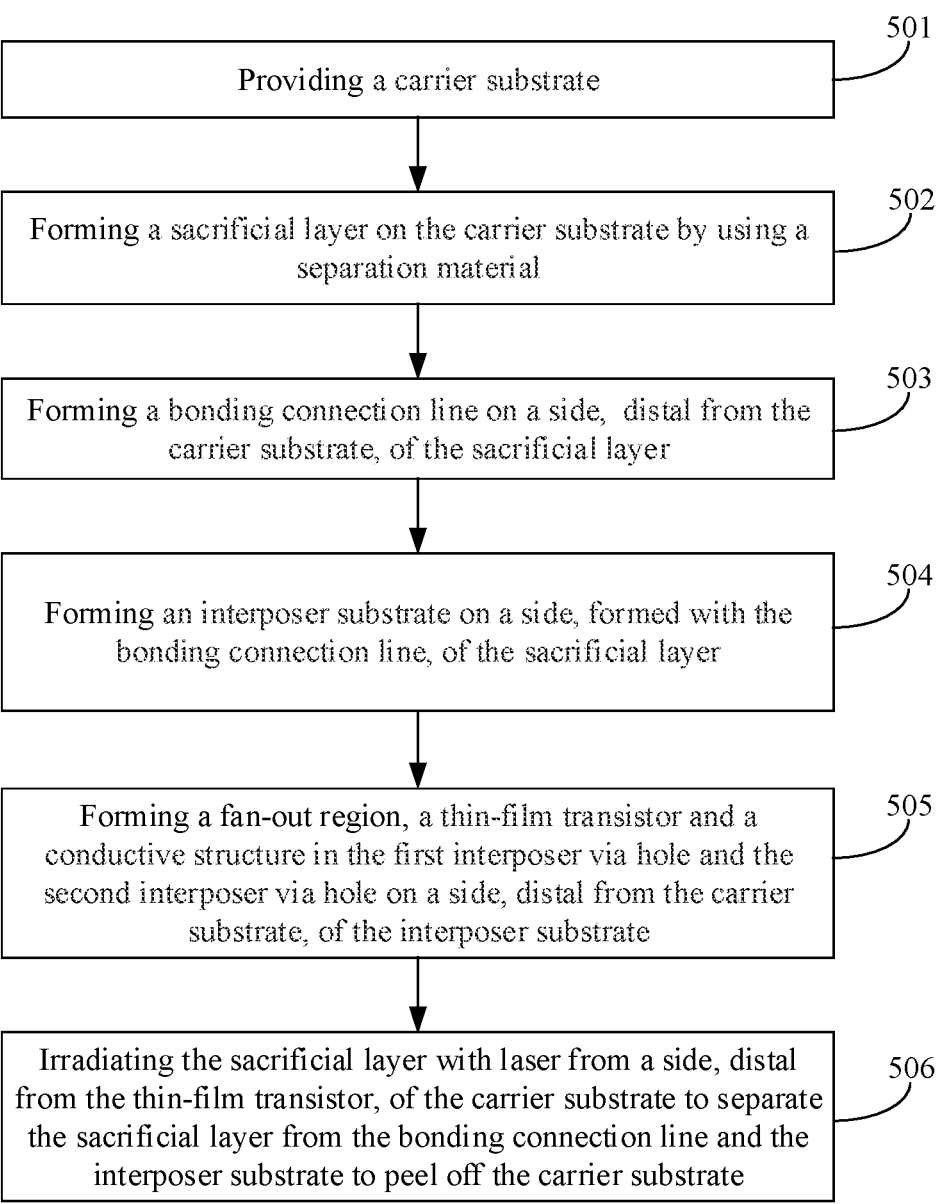
FIG. 5 is a flowchart of another manufacturing method of an array substrate according to some embodiments of the present disclosure.

FIG. 5 is a flowchart of another manufacturing method of an array substrate according to an embodiment of the present disclosure. As shown in FIG. 5, the method includes the following steps.

In step 501, a carrier substrate is provided.

In some embodiments, the material for fabricating the carrier substrate includes at least one of glass, silicon wafer, quartz, and plastic, which is not limited in the embodiment of the present disclosure.

In step 502, a sacrificial layer is formed on the carrier substrate by using a separation material.

The separation material is adhesive and forms a sacrificial layer by adhering to the carrier substrate. In addition, the separation material also has high temperature resistance, which avoids changing the properties of the sacrificial layer during the subsequent film layer fabrication process and affecting the fabrication of the array substrate.

In some embodiments, the separation material includes one of an amorphous silicon material and an organic resin material. For example, the separation material is a PI resin material or the like.

In some embodiments, the sacrificial layer is formed by coating the separation material on the carrier substrate.

In step 503, a bonding connection line is formed on a side, distal from the carrier substrate, of the sacrificial layer.

In some embodiments, the bonding connection line is formed on a side of the sacrificial layer distal from the carrier substrate through a patterning process, a sputtering process, or an evaporation process. A material of the bonding connection line is copper, silver or other metals. The material and fabrication method of the bonding connection line are not limited in the embodiment of the present disclosure. The patterning process includes photoresist coating, exposure, development, etching, and photoresist stripping.

An adhesion between the separation material and the carrier substrate is greater than an adhesion between the separation material and the bonding connection line. That is, the sacrificial layer is easier to be separated from the bonding connection line and more difficult to be separated from the carrier substrate under an external effect.

In some embodiments, the bonding connection line includes a first lead and a second lead insulated from each other. The first lead is configured to be connected to a gate drive circuit in a drive circuit. The second lead is configured to be connected to a data drive circuit in the drive circuit. In some embodiments, the bonding connection line further includes other leads, for example, includes a lead for connecting a power control circuit and the like.

In some embodiments, the interposer substrate is further provided with a third interposer via hole, a conductive structure is arranged in the third interposer via hole, a VDD line and a VSS line of the thin-film transistor are electrically connected to the bonding connection line by the fan-out region and the conductive structure in the third interposer via hole.

In step 504, an interposer substrate is formed on a side, formed with the bonding connection line, of the sacrificial layer, An adhesion between the separation material and the carrier substrate is greater than an adhesion between the separation material and the interposer substrate. That is, the sacrificial layer is easier to be separated from the interposer substrate and more difficult to be separated from the carrier substrate under an external effect.

In some embodiments, the implementation process of step 504 includes the following steps.

In step 5041, a substrate layer is formed on the side, formed with the bonding connection line, of the sacrificial layer.

In some embodiments, the substrate layer is formed on the side, formed with the bonding connection line, of the sacrificial layer through a coating and a low temperature curing process using an organic resin material.

In some embodiments, the substrate layer is formed on the side, formed with the bonding connection line, of the sacrificial layer through an attach process. The first lead is disposed on the first end of the interposer substrate, and the second lead is disposed on the second end of the interposer substrate, and the first end is opposite to the second end.

In step 5042, a first interposer via hole and a second interposer via hole are formed on the substrate layer to obtain an interposer substrate.

In some embodiments, the first interposer via hole and the second interposer via hole are respectively arranged on a first end and a second end of the interposer substrate. Both the first interposer via hole and the second interposer via hole are provided with the conductive structure. A gate of the thin-film transistor is electrically connected to the first lead by the conductive structure in the first interposer via hole. One of a source and a drain of the thin-film transistor is electrically connected to the second lead by the conductive structure in the second interposer via hole. The first lead is configured to be connected to the gate drive circuit in the drive circuit. The second lead is configured to be connected to the data drive circuit in the drive circuit.

In some embodiments, an overlap region is defined between an orthographic projection of the first interposer via hole formed on the substrate layer on the carrier substrate and an orthographic projection of the first lead on the carrier substrate, such that the conductive structure in the first interposer via hole is electrically connected to the first lead; and an overlap region is defined between an orthographic projection of the second interposer via hole formed on the substrate layer on the carrier substrate and an orthographic projection of the second lead on the carrier substrate, such that the conductive structure in the second interposer via hole is electrically connected to the second lead, In some embodiments, the first interposer via hole and second interposer via hole are formed on the substrate layer by an etching process. For example, the first interposer via hole and the second interposer via hole are formed on the substrate layer by an inductive coupled plasma (ICP) etching process.

In step 505, a fan-out region, a thin-film transistor and conductive structure in the first interposer via hole and the second interposer via hole are formed on a side, distal from the carrier substrate, of the interposer substrate.

An orthographic projection of the fan-out region onto interposer substrate is partially overlapped with an orthographic projection of the thin-film transistor onto the interposer substrate. The first lead is electrically connected to the thin-film transistor by the conductive structure in the first interposer via hole and the fan-out region, and the second lead is electrically connected to the thin-film transistor by the conductive structure in the second interposer via hole and the fan-out region. In some embodiments of the present disclosure, the fan-out region includes a first sub-fan-out region and a second sub-fan-out region, the first sub-fan-out region and the second sub-fan-out region are respectively disposed on the first end and the second end of the interposer substrate. A gate of the thin-film transistor is electrically connected to the first lead by the first sub-fan-out region and the conductive structure in the first interposer via hole, and a source or a drain of the thin-film transistor is electrically connected to the second lead by the second sub-fan-out region and the conductive structure in the second interposer via hole.

In some embodiments of the present disclosure, in response to the thin-film transistor is a thin-film transistor with a bottom-gate structure, the implementation process of step 505 includes the following steps.

in step 5051a, a conductive layer is formed on a side, distal from the carrier substrate, of the interposer substrate by using a conductive material.

In some embodiments, the conductive material is formed on a side, distal from the carrier substrate, of the interposer substrate by deposition, sputtering, or evaporation. The conductive material includes at least one of aluminum, neodymium, and molybdenum.

in step 5052a, the conductive layer is patterned to form a fan-out region, a gate and the conductive structure in the first interposer via hole and the second interposer via hole.

In some embodiments, the conductive layer is patterned by a patterning process.

It should be noted that, by patterning the conductive layer, a fan-out region, a gate and a conductive structure in the first interposer via hole and the second interposer via hole are formed at the same time, which simplifies the fabrication process of the array substrate. Alternatively, the fan-out region, the gate and the conductive structure in the interposer via hole are also be formed separately. For example, the fan-out region is formed firstly by a patterning process, then the conductive structure in the interposer via hole is formed by a patterning process, and at last the gate is formed by a patterning process.

In some embodiments, the fan-out region is located between the interposer substrate and the gate, including a plurality of gate control lines and a plurality of data control lines. One end of each gate control line is electrically connected to the gate of the thin-film transistor, and the other end of each gate control line is electrically connected to the first lead by the conductive structure in the first interposer via hole. One end of each data control line is electrically connected to the source or the drain of the thin-film transistor, and the other end of each data control line is electrically connected to the second lead by the conductive structure in the second interposer via hole.

Further, a gate insulating layer, an active layer pattern, and a source-drain pattern are sequentially formed on the interposer substrate having the gate. The implementation process refers to the following steps 5053a to 5055a.

In step 5053a, a gate insulating layer is formed on a side, formed with the gate, of the interposer substrate.

In some embodiments, a material for fabricating the gate insulating layer includes at least one of silicon dioxide, silicon nitride, and aluminum oxide. For example, the gate insulating layer is formed on the interposer substrate having the gate by deposition.

In step 5054a, an active layer pattern is formed on a side, formed with the gate insulating layer, of the interposer substrate.

In some embodiments, a material for fabricating the active layer pattern includes at least one of IGZO, LTPS, and LTPO. For example, a patterning process is used to form the active layer pattern on the interposer substrate having the gate insulating layer.

In step 5055a, a source-drain pattern is formed on a side, formed with the active layer pattern, of the interposer substrate.

In some embodiments, a material for fabricating the source-drain pattern includes at least one of aluminum, neodymium, and molybdenum. For example, a patterning process is used to form the source-drain pattern on the interposer substrate having the active layer pattern.

In some embodiments of the present disclosure, in response to the thin-film transistor is a thin-film transistor with a top-gate structure, the implementation process of step 505 includes: forming a conductive layer on a side, distal from the carrier substrate, of the interposer substrate by using a conductive material; forming the conductive structure in the first interposer via hole and the second interposer via hole by patterning the conductive layer; and forming the fan-out region and the thin-film transistor on the side, formed with the conductive structure, of the interposer substrate. The fabrication process of the thin-film transistor includes the following steps.

In step 5051*b*, an active layer pattern is formed on the side, formed with the conductive structure, of the interposer substrate in the first interposer via hole and the second interposer via hole, and the active layer pattern being insulated from the conductive structure in the first interposer via hole and the second interposer via hole.

The material and fabrication method of the active layer pattern can refer to the above-mentioned step 5054*a*, which are not described in detail herein.

In step 5052*b*, a gate insulating layer is formed on the side, formed with the active layer pattern, of the interposer substrate.

For the material and fabrication method of the gate insulating layer, reference is made to the above-mentioned step 5053*a*, which are not described in detail herein.

In step 5053*b*, a gate is formed on the side, formed with the gate insulating layer, of the interposer substrate.

For the material and fabrication method of the gate, reference is made to the above-mentioned step 5051*a*, which are not described in detail herein.

In step 5054*b*, a passivation layer is formed on the side, formed with the gate, of the interposer substrate.

In some embodiments, a material for fabricating the passivation layer includes at least one of silicon dioxide, silicon nitride, and aluminum oxide. For example, the passivation layer is formed on the interposer substrate having the gate by deposition.

In step 5055*b*, a source-drain pattern is formed on the side, formed with the passivation layer, of the interposer substrate.

For the material and fabrication method of the source-drain pattern, reference is made to the above-mentioned step 5055*a*, which are not described in detail herein.

In step 506, the sacrificial layer is irradiated with laser from a side, distal from the thin-film transistor, of the carrier substrate, such that the sacrificial layer is separated from the bonding connection line and the interposer substrate, so as to peel off the carrier substrate.

It should be noted that in response to the carrier substrate is a glass substrate or other substrate that is difficult to be separated from metal materials (bonding connecting line), by forming a sacrificial layer on the carrier substrate, and after preparing the thin-film transistor, separating the sacrificial layer from the bonding connection line to realize the peeling off of the carrier substrate, which can avoid damage to the bonding connection line and improve the reliability of the fabricated of the array substrate.

In some embodiments of the present disclosure, in response to the thin-film transistor is a thin-film transistor with a double-gate structure, the implementation process of step 505 includes: forming a conductive layer on a side, distal from the carrier substrate, of the interposer substrate by using a conductive material; forming a fan-out region, a bottom gate electrode, and the conductive structure in the first interposer via hole and the second interposer via hole by patterning the conductive layer; forming a gate insulating layer on the side, formed with the bottom gate electrode, of the interposer substrate; forming a active layer pattern on the side, formed with the gate insulating layer, of the interposer substrate; forming a source-drain pattern on the side, formed with the active layer pattern, of the interposer substrate; forming a passivation layer on the side, formed with the source-drain pattern, of the interposer substrate; and forming a top gate electrode on the side, formed with the passivation layer, of the interposer substrate.

In some embodiments, before forming the active layer pattern on the interposer substrate, the method further includes: forming a shield layer on the side, formed with the fan-out region, the gate and the conductive structure, of the interposer substrate. The shield layer includes a shield pattern and a connecting lead connected with the shield pattern, and the shield pattern is the same as an active layer pattern of the thin-film transistor. A plurality of shield patterns are connected together by connecting leads for loading constant voltage. The shield layer is configured to reduce the impact of the current in the fan-out line on the performance of the active layer.

In summary, according to the method for manufacturing an array substrate provided by the embodiments of the present disclosure, a sacrificial layer is formed on a carrier substrate, then a bonding connection line is formed on the sacrificial layer, after that an interposer substrate is formed on the side, formed with the bonding connection line, of the sacrificial layer, further a fan-out region and a thin-film transistor are formed on a side, distal from the carrier substrate, of the interposer substrate, and finally the sacrificial layer is irradiated with laser to be separated from the bonding connection line and the interposer substrate, so that the carrier substrate is peeled off to obtain the array substrate. Since the bonding connection line, the interposer substrate, the fan-out region and the thin-film transistor are sequentially formed on the carrier substrate, compared with the related art, there is no need to separately fabricate the bonding connection line and the thin-film transistor on both sides of the existing interposer substrate, which improves the fabrication yield of the array substrate, reduces the process difficulty, and also reduces the fabrication cost of the array substrate.

FIG. 6 is a flowchart of a manufacturing method of a display device according to an embodiment of the present disclosure. As shown in FIG. 6, the method includes the following steps.

In step 601, a sacrificial layer is formed on a carrier substrate by using a separation material.

In step 602, a bonding connection line is formed on a side, distal from the carrier substrate, of the sacrificial layer. The bonding connection line includes a first lead and a second lead that are insulated from each other.

In step 603, an interposer substrate is formed on a side, formed with the bonding connection line, of the sacrificial layer, and the interposer substrate is provided with a first interposer via hole and a second interposer via hole. An adhesion between the separation material and the carrier substrate is greater than an adhesion between the separation material and the bonding connection line, and is greater than an adhesion between the separation material and the interposer substrate.

In step 604, a fan-out region, a thin-film transistor and conductive structure in the first interposer via hole and the second interposer via hole are formed on a side, distal from the carrier substrate, of the interposer substrate. An orthographic projection of the fan-out region onto the interposer substrate is partially overlapped with an orthographic projection of the thin-film transistor onto the interposer substrate. The first lead is electrically connected to the thin-film transistor by the conductive structure in the first interposer via hole and the fan-out region, and the second lead is electrically connected to the thin-film transistor by the conductive structure in the second interposer via hole and the fan-out region.

In step 605, a light-emitting unit is formed on a side, distal from the carrier substrate, of the thin-film transistor.

In step 606, the sacrificial layer is irradiated with laser from a side, distal from the thin-film transistor, of the carrier substrate to be separated from the bonding connection line and the interposer substrate, so that the carrier substrate is peeled off.

In some embodiments, for the implementation process of the above steps 601 to 604 and 606, reference is made to the relevant steps in the above-mentioned fabrication process of the array substrate, which are not described in detail herein.

In some embodiments, the light-emitting unit includes one of u-LED, OLED, and QLED. In response to the light-emitting unit is the u-LED, the implementation process of step 604 includes: providing the u-LED on a side of the thin-film transistor distal from the carrier substrate by transfer, and fixing the u-LED by bonding.

In summary, according to the method for manufacturing a display device provided by the embodiments of the present disclosure, a sacrificial layer is formed on a carrier substrate, then a bonding connection line is formed on the sacrificial layer, after that an interposer substrate is formed on the side, formed with the bonding connection line, of the sacrificial layer, further a fan-out region, a thin-film transistor and a light-emitting unit are sequentially formed on a side, distal from the carrier substrate, of the interposer substrate, and finally the sacrificial layer is irradiated with laser to be separated from the bonding connection line and the interposer substrate, so that the carrier substrate is peeled off. Since the bonding connection line, the interposer substrate, the fan-out region and the thin-film transistor are sequentially formed on the carrier substrate, compared with the related art, there is no need to separately prepare the bonding connection line and the thin-film transistor on both sides of the existing interposer substrate, which improves the fabrication yield of the array substrate, reduces the process difficulty, and thus improves the reliability of the fabricated display device.

It should be noted that, after the carrier substrate is peeled off, the bonding connection line on the side of the interposer substrate distal from the thin-film transistor is exposed. In some embodiments, after the carrier substrate is peeled off, a drive circuit is formed on a side of the interposer substrate having the bonding connection line by a bonding process, and the drive circuit is connected to the bonding connection line.

Figure 7:
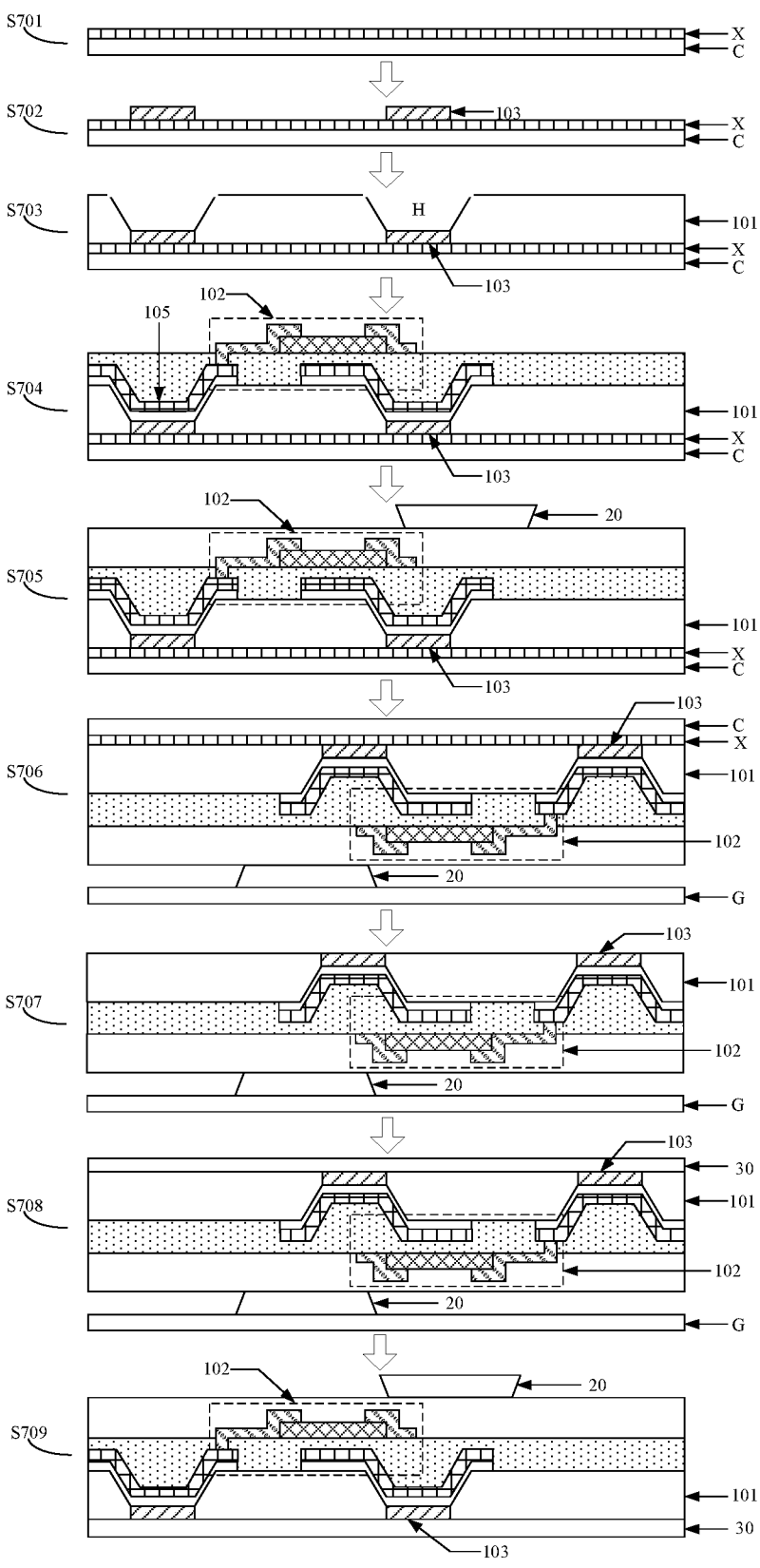
FIG. 7 is a flowchart of a manufacturing process of a display device according to some embodiments of the present disclosure.

Exemplarily, FIG. 7 is a flowchart of a manufacturing process of a display device according to an embodiment of the present disclosure. As shown in FIG. 7, including the following steps.

In S701, a sacrificial layer X is formed on a carrier substrate C by using a separation material.

In S702, a bonding connection line 103 is formed on a side of the sacrificial layer X distal from the carrier substrate C. The bonding connection line 103 includes a first lead 1031 and a second lead 1032 insulated from each other.

In S703, an interposer substrate 101 is formed on the carrier substrate C having the bonding connection line 103. An adhesion between the separation material and the carrier substrate is greater than an adhesion between the separation material and the bonding connection line 103, and is greater than an adhesion between the separation material and the interposer substrate 101.

Referring to FIG. 7, the interposer substrate 101 has an interposer via hole H, and the interposer via hole H includes the first interposer via hole and the second interposer via hole.

In S704, a fan-out region 105, a thin-film transistor 102 and conductive structure in the first interposer via hole and the second interposer via hole are formed on a side, distal from the carrier substrate C, of the interposer substrate 101.

In some embodiments, for the implementation process of the above S701 to S704, reference is made to the above steps 501 to 505, which are not described in detail herein.

In S705, a light-emitting unit 20 is formed on a side, distal from the carrier substrate C, of the thin-film transistor 102, In S706, the light-emitting unit 20 is adhered to a fixed substrate G by an ultraviolet adhesive.

In S707, the sacrificial layer X is irradiated with laser from a side, distal from the thin-film transistor 102, of the carrier substrate C, such that the sacrificial layer X is separated from the bonding connection line 103 and the interposer substrate 101, to peel off the carrier substrate C.

In S708, a drive circuit 30 is formed on a side, formed with the bonding connection line 103, of the interposer substrate 101 by a bonding process. The drive circuit 30 is connected to the bonding connection line 103.

In S709, the fixed substrate is peeled off to obtain a display device.

In some embodiments, the ultraviolet adhesive is irradiated with ultraviolet light from a side, distal from the interposer substrate, of the fixed substrate to separate the fixed substrate from the light-emitting unit.

In summary, according to the method for manufacturing a display device provided by the embodiments of the present disclosure, a sacrificial layer is formed on a carrier substrate, then a bonding connection line is formed on the sacrificial layer, after that an interposer substrate is formed on the side, formed with the bonding connection line, of the sacrificial layer, further a fan-out region, a thin-film transistor and a light-emitting unit are sequentially formed on a side, distal from the carrier substrate, of the interposer substrate, and finally the sacrificial layer is irradiated with laser to be separated from the bonding connection line and the interposer substrate, so that the carrier substrate is peeled off. Since the bonding connection line, the interposer substrate, the fan-out region and the thin-film transistor are sequentially formed on the carrier substrate, compared with the related art, there is no need to separately fabricate the bonding connection line and the thin-film transistor on both sides of the existing interposer substrate, which improves the fabrication yield of the array substrate, reduces the process difficulty, and thus improves the reliability of the fabricated display device.

It should be noted that the order of steps in the manufacturing method of an array substrate and the manufacturing method of a display device according to the embodiments of the present disclosure are appropriately adjusted, and the steps are increased or decreased correspondingly according to circumstances. Any skilled in the art can easily think of changes within the technical scope disclosed in this disclosure which should be covered by the protection scope of this disclosure, and is not described in detail herein.

Described above are merely optional embodiments of the present disclosure, and are not intended to limit the present disclosure. Within the spirit and principles of the disclosure, any modifications, equivalent substitutions, improvements, or the like are within the protection scope of the present disclosure.

What is claimed is:

1. An array substrate, comprising:

an interposer substrate, a fan-out region disposed on one side of the interposer substrate, a thin-film transistor disposed on one side, distal from the interposer substrate, of the fan-out region, and a bonding connection line disposed on the other side of the interposer substrate;

an orthographic projection of the fan-out region onto the interposer substrate is partially overlapped with an orthographic projection of the thin-film transistor onto the interposer substrate; and the bonding connection line is configured to be connected to a drive circuit, and comprises a first lead and a second lead that are insulated from each other;

wherein the interposer substrate is provided with a first interposer via hole and a second interposer via hole, conductive structure is arranged in the first interposer via hole and the second interposer via hole, the first lead is electrically connected to the thin-film transistor by the conductive structure in the first interposer via hole and the fan-out region, and the second lead is electrically connected to the thin-film transistor by the conductive structure in the second interposer via hole and the fan-out region, wherein the first interposer via hole and the second interposer via hole are respectively arranged on a first end and a second end of the interposer substrate, the first end is opposite to the second end.

2. The array substrate according to claim 1, wherein the first lead is disposed on the first end of the interposer substrate and is configured to be connected to a gate drive circuit in the drive circuit, and the second lead is disposed on the second end of the interposer substrate and is configured to be connected to a data drive circuit in the drive circuit;

the fan-out region comprises a first sub-fan-out region and a second sub-fan-out region, wherein the first sub-fan-out region and the second sub-fan-out region are respectively disposed on the first end and the second end of the interposer substrate; and a gate of the thin-film transistor is electrically connected to the conductive structure in the first interposer via hole by the first sub-fan-out region, and a source or a drain of the thin-film transistor is electrically connected to the conductive structure in the second interposer via hole by the second sub-fan-out region.

3. The array substrate according to claim 1, wherein the array substrate further comprises a shield layer disposed on the side, distal from the bonding connection line, of the interposer substrate;

the shield layer comprises a shield pattern and a connecting lead connected with the shield pattern, and the shield pattern is the same as an active layer pattern of the thin-film transistor.

4. The array substrate according to claim 3, wherein the shield layer is electrically connected to the drive circuit by a connecting line through a fourth interposer via hole to apply a constant voltage.

5. The array substrate according to claim 1, wherein the thin-film transistor comprises a gate electrode, a gate insulating layer, an active layer pattern, and a source-drain pattern that are stacked in a direction distal from the interposer substrate, wherein the source-drain pattern comprises a source and a drain.

6. The array substrate according to claim 5, wherein the gate of the thin-film transistor and the conductive structure in the first interposer via hole are integrally formed.

7. The array substrate according to claim 1, wherein the thin-film transistor comprises a first gate electrode, a first gate insulating layer, an active layer pattern, a second gate insulating layer, a second gate electrode, a passivation layer, and a source-drain pattern that are stacked in a direction distal from the interposer substrate, wherein the source-drain pattern comprises a source and a drain.

8. The array substrate according to claim 7, wherein the second gate electrode of the thin-film transistor is electrically connected to the source-drain pattern by a first via hole, and the first gate electrode of the thin-film transistor is electrically connected to the source-drain pattern by a second via hole.

9. The array substrate according to claim 7, wherein the first gate electrode of the thin-film transistor is arranged on a same layer with the fan-out region.

10. The array substrate according to claim 1, wherein the thin-film transistor comprises an active layer pattern, a gate insulating layer, a gate pattern, a passivation layer, and a source-drain pattern that are stacked in a direction distal from the interposer substrate, wherein the gate pattern comprises a gate and a gate lead, and the source-drain pattern comprises a source and a drain.

11. The array substrate according to claim 1, wherein the fan-out region comprises a hollow part, and the hollow part is overlapped with an active layer pattern of the thin film transistor.

12. The array substrate according to claim 1, wherein the interposer substrate is further provided with a third interposer via hole, a conductive structure is arranged in the third interposer via hole, a VDD line and a VSS line of the thin-film transistor are electrically connected to the bonding connection line by the fan-out region and the conductive structure in the third interposer via hole.

13. The array substrate according to claim 1, wherein the array substrate further comprises a bonding pad disposed on a side, distal from the interposer substrate, of the thin-film transistor.

14. A manufacturing method of the array substrate according to claim 1, comprising:

forming a sacrificial layer on a carrier substrate by using a separation material;

forming a bonding connection line on a side, distal from the carrier substrate, of the sacrificial layer, wherein the bonding connection line comprises a first lead and a second lead that are insulated from each other;

forming an interposer substrate on a side, formed with the bonding connection line, of the sacrificial layer, wherein the interposer substrate is provided with a first interposer via hole and a second interposer via hole, and an adhesion between the separation material and the carrier substrate is greater than an adhesion between the separation material and the bonding connection line, and is greater than an adhesion between the separation material and the interposer substrate;

forming a fan-out region, a thin-film transistor and conductive structure in the first interposer via hole and the second interposer via hole on a side, distal from the carrier substrate, of the interposer substrate, wherein an orthographic projection of the fan-out region onto the interposer substrate is partially overlapped with an orthographic projection of the thin-film transistor onto the interposer substrate, the first lead is electrically connected to the thin-film transistor by the conductive structure in the first interposer via hole and the fan-out region, and the second lead is electrically connected to the thin-film transistor by the conductive structure in the second interposer via hole and the fan-out region; and irradiating the sacrificial layer with laser from a side, distal from the thin-film transistor, of the carrier substrate to separate the sacrificial layer from the bonding connection line and the interposer substrate to peel off the carrier substrate.

15. The method according to claim 14, wherein forming the interposer substrate on the side, formed with the bonding connection line, of the sacrificial layer comprises:

forming a substrate layer by coating and curing an organic resin material on the side, formed with the bonding connection line, of the sacrificial layer, wherein the first interposer via hole and the second interposer via hole are respectively arranged on a first end and a second end of the substrate layer, the first end is opposite to the second end; and respectively forming the first interposer via hole and the second interposer via hole on the first end and the second end of the substrate layer to obtain the interpose substrate;

wherein the fan-out region comprises a first sub-fan-out region and a second sub-fan-out region, wherein the first sub-fan-out region and the second sub-fan-out region are respectively disposed on the first end and the second end of the interposer substrate; a gate of the thin-film transistor is electrically connected to the first lead by the conductive structure in the first interposer via hole and the first sub-fan-out region, and a source or a drain of the thin-film transistor is electrically connected to the second lead by the conductive structure in the second interposer via hole and the second sub-fan-out region, the first lead is configured to be connected to a gate drive circuit in the drive circuit, and the second lead is configured to be connected a data drive circuit in the drive circuit.

16. The method according to claim 14, wherein forming the fan-out region, the thin-film transistor and the conductive structure in the first interposer via hole and the second interposer via hole on the side, distal from the carrier substrate, of the interposer substrate comprises:

forming a conductive layer on the side, distal from the carrier substrate, of the interposer substrate by using a conductive material;

patterning the conductive layer to form the fan-out region, a gate of the thin-film transistor and the conductive structure in the first interposer via hole and the second interposer via hole; and sequentially forming a gate insulating layer, an active layer pattern, and a source-drain pattern of the thin-film transistor on a side, formed with the fan-out region, the gate and the conductive structure, of the interposer substrate;

or forming the conductive layer on the side, distal from the carrier substrate, of the interposer substrate by using the conductive material;

forming the conductive structure in the first interposer via hole and the second interposer via hole by patterning the conductive layer; and sequentially forming the fan-out region and the thin-film transistor on a side, formed with the conductive structure, of the interposer substrate.

17. The method according to claim 16, wherein before forming the active layer pattern of the thin-film transistor, the method further comprises:

forming a shield layer on the side, formed with at least the fan-out region and the conductive structure, of the interposer substrate, wherein the shield layer comprises a shield pattern and a connecting lead connected with the shield pattern, and the shield pattern is the same as an active layer pattern of the thin-film transistor.

18. A display device, comprising: a light-emitting unit and an array substrate, wherein the light-emitting unit is disposed on a side, distal from the interposer substrate, of the thin-film transistor in the array substrate; and the array substrate, comprising:

an interposer substrate, a fan-out region disposed on one side of the interposer substrate, a thin-film transistor disposed on one side, distal from the interposer substrate, of the fan-out region, and a bonding connection line disposed on the other side of the interposer substrate;

an orthographic projection of the fan-out region onto the interposer substrate is partially overlapped with an orthographic projection of the thin-film transistor onto the interposer substrate; and the bonding connection line is configured to be connected to a drive circuit, and comprises a first lead and a second lead that are insulated from each other;

wherein the interposer substrate is provided with a first interposer via hole and a second interposer via hole, conductive structure is arranged in the first interposer via hole and the second interposer via hole, the first lead is electrically connected to the thin-film transistor by the conductive structure in the first interposer via hole and the fan-out region, and the second lead is electrically connected to the thin-film transistor by the conductive structure in the second interposer via hole and the fan-out region, wherein the first interposer via hole and the second interposer via hole are respectively arranged on a first end and a second end of the interposer substrate, the first end is opposite to the second end.

19. The display device according to claim 18, further comprising a drive circuit, wherein the drive circuit is disposed on a side, distal from the thin-film transistor, of the interposer substrate, and the drive circuit is electrically connected to the bonding connection line in the array substrate.

20. The display device according to claim 18, wherein the light-emitting unit is arranged on a bonding pad of the array substrate by bonding; and the light-emitting unit comprises a micro light-emitting diode, an organic light-emitting diode, or a quantum dot light-emitting diode.

* * * * *